(12) United States Patent
Wei (10) Patent No.: US 12,015,385 B2
(45) Date of Patent: Jun. 18, 2024

(54) AUDIO AMPLIFIER CIRCUIT AND CONTROLLING METHOD THEREOF

(71) Applicant: Realtek Semiconductor Corporation, Hsinchu (TW)

(72) Inventor: Tzu-Chieh Wei, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 226 days.

(21) Appl. No.: 17/663,015

(22) Filed: May 11, 2022

(65) Prior Publication Data

US 2023/0208363 A1 Jun. 29, 2023

(30) Foreign Application Priority Data

Dec. 29, 2021 (TW) ................................ 110149437

(51) Int. Cl.
*H03F 3/183* (2006.01)
*H03F 3/217* (2006.01)
*H03F 3/38* (2006.01)

(52) U.S. Cl.
CPC ......... *H03F 3/183* (2013.01); *H03F 2200/03* (2013.01); *H03F 2200/165* (2013.01)

(58) Field of Classification Search
CPC .............. H03F 3/183; H03F 2200/03; H03F 2200/165; H03F 1/26; H03F 3/2171; H03F 3/187
USPC ....................................... 330/251, 10, 207 A
See application file for complete search history.

(56) References Cited

U.S. PATENT DOCUMENTS

| | | | |
|---|---|---|---|
| 8,553,909 B2 | 10/2013 | Wang et al. | |
| 8,686,789 B2 * | 4/2014 | Jiang | H03G 3/348 330/10 |
| 9,673,762 B2 * | 6/2017 | Zhang | H03F 1/0205 |
| 11,764,741 B1 * | 9/2023 | Melanson | G01R 27/14 330/251 |

OTHER PUBLICATIONS

X. Jiang et al., "Circuit techniques to overcome class-D audio amplifier limitations in mobile devices," in Proc. VLSI Symp. Dig. Tech. Papers, Jun. 2012, pp. 18-19.
Xicheng Jiang, "Fundamentals of Audio Class D Amplifier Design: A Review of Schemes and Architectures," Computer Science/ IEEE Solid-State Circuits Magazine, Aug. 25, 2017, pp. 14-25.

* cited by examiner

*Primary Examiner* — Hieu P Nguyen
(74) *Attorney, Agent, or Firm* — CKC & Partners Co., LLC (57) ABSTRACT

Audio amplifier circuit includes a pulse width modulation circuit, an auxiliary loop circuit corresponding to a first variable resistance value and a first variable current value, and a main loop circuit corresponding to a second variable resistance value and a second variable current value. Main loop circuit is coupled between a second node, an output terminal, and a first node. Under a condition that auxiliary loop circuit and main loop circuit are turned on, second variable resistance value is decreased and second variable current value is increased after auxiliary loop circuit enters into a first control state, such that main loop circuit enters into a second control state. First variable resistance value is increased and first variable current value is decreased after main loop circuit enters into second control state, such that auxiliary loop circuit is out of first control state.

17 Claims, 12 Drawing Sheets

|  | T120 | | T130 | | T100 |
| --- | --- | --- | --- | --- | --- |
|  | RAUX1 | 121A | RFB1 | 131A | |
| First stage | r | i | ✗ | ✗ | T |
| | r | i | 8r | 0.125i | 0.89T |
| | r | i | 4r | 0.25i | 0.8T |
| Second stage | r | i | 2r | 0.5i | 0.67T |
| | 2r | 0.5i | 2r | 0.5i | T |
| | 2r | 0.5i | r | i | 0.67T |
| Third stage | ✗ | ✗ | r | i | T |

FIG. 4

|  | T120 | | T130 | | T100 |
| --- | --- | --- | --- | --- | --- |
|  | RAUX1 | 121A | RFB1 | 131A | |
| First stage | r | i | ✕ | ✕ | T |
|  | r | i | 8r | 0.125i | 0.89T |
|  | r | i | 4r | 0.25i | 0.8T |
|  | r | i | 3r | 0.33i | 0.75T |
| Second stage | 1.5r | 0.67i | 3r | 0.33i | T |
|  | 1.5r | 0.67i | 2r | 0.5i | 0.86T |
|  | 2r | 0.5i | 2r | 0.5i | T |
|  | 2r | 0.5i | 1.5r | 0.67i | 0.86T |
|  | 3r | 0.33i | 1.5r | 0.67i | T |
|  | 3r | 0.33i | r | i | 0.75T |
| Third stage | ✕ | ✕ | r | i | T |

AUDIO AMPLIFIER CIRCUIT AND CONTROLLING METHOD THEREOF

RELATED APPLICATIONS

This application claims priority to Taiwanese Application Serial Number 110149437, filed Dec. 29, 2021, which is herein incorporated by reference.

BACKGROUND

Technical Field

The present disclosure relates to an audio technology. More particularly, the present disclosure relates to an audio amplifier circuit and a controlling method thereof capable of reducing pop noises.

Description of Related Art

With the progress of science and technology, many electronic devices can be used to output audio signals. However, in some related technologies, pop noises are generated at the moments that the audio component (such as an audio amplifier circuit) supplies power, the power of the audio component is cuts off, or the audio component performs various operations. The pop noises cause uncomfortable hearing experience for the users.

SUMMARY

Some aspects of the present disclosure are to provide an audio amplifier circuit. The audio amplifier circuit includes a pulse width modulation circuit, an auxiliary loop circuit, and a main loop circuit. The pulse width modulation circuit is coupled between a first node and a second node. The auxiliary loop circuit is coupled between the second node and the first node. The auxiliary loop circuit is corresponded to a first variable resistance value and a first variable current value. The main loop circuit is coupled between the second node, an output terminal, and the first node. The main loop circuit is corresponded to a second variable resistance value and a second variable current value. Under a condition that the auxiliary loop circuit and the main loop circuit are both turned on, the second variable resistance value is decreased and the second variable current value is increased after the auxiliary loop circuit enters into a first control state, such that the main loop circuit enters into a second control state. The first variable resistance value is increased and the first variable current value is decreased after the main loop circuit enters into the second control state, such that the auxiliary loop circuit is out of the first control state.

Some aspects of the present disclosure are to provide a controlling method of an audio amplifier circuit. The audio amplifier circuit includes an auxiliary loop circuit and a main loop circuit. The auxiliary loop circuit is corresponded to a first variable resistance value and a first variable current value. The main loop circuit is corresponded to a second variable resistance value and a second variable current value. The controlling method includes the following operations: decreasing the second variable resistance value and increasing the second variable current value after the auxiliary loop circuit enters into a first control state under a condition that the auxiliary loop circuit and the main loop circuit are both turned on, such that the main loop circuit enters into a second control state; and increasing the first variable resistance value and decreasing the first variable current value after the main loop circuit enters into the second control state, such that the auxiliary loop circuit is out of the first control state.

As described above, the audio amplifier circuit and the controlling method thereof according to the present disclosure can effectively reduce the pop noises to avoid the uncomfortable hearing experience for the user.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
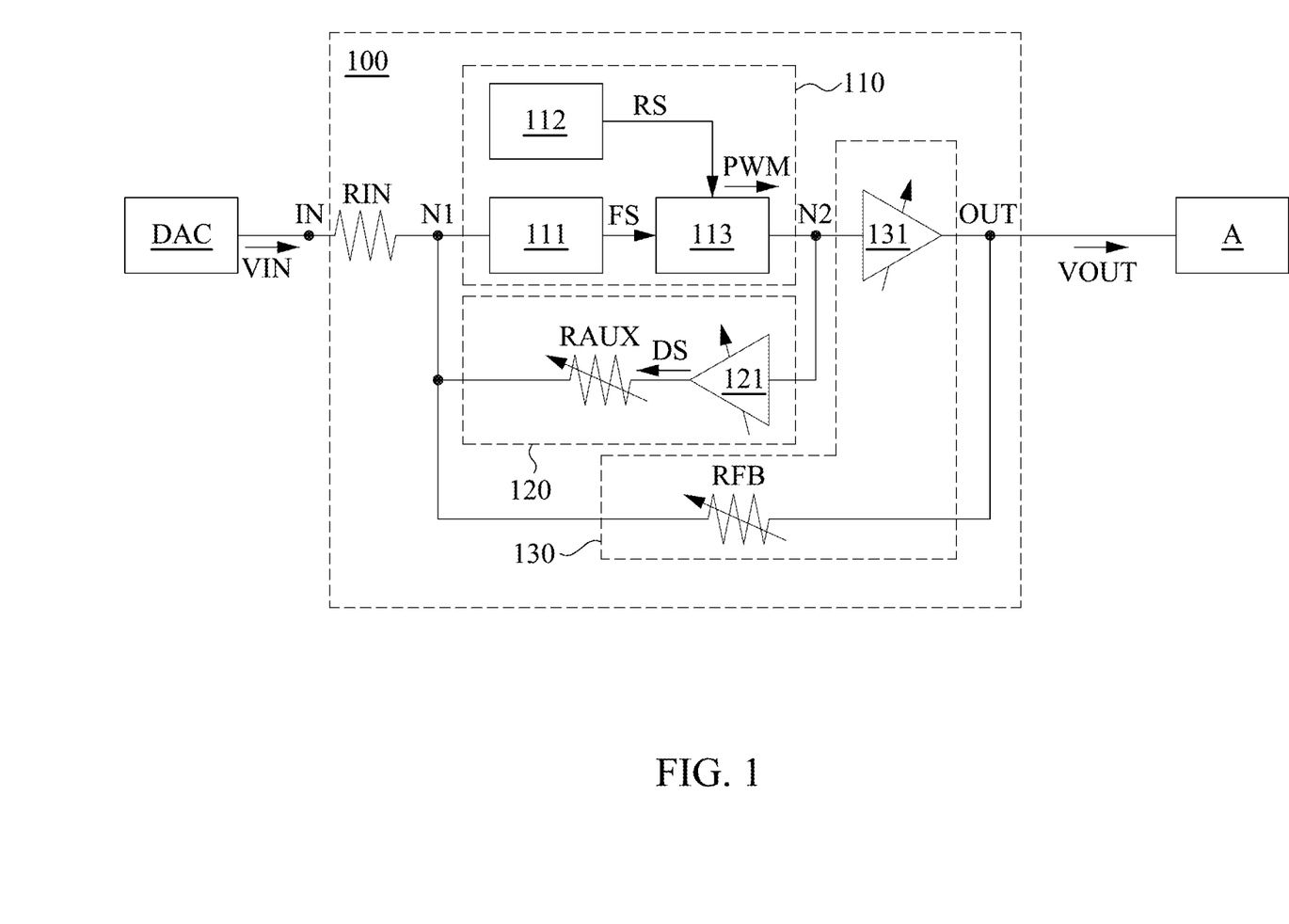
FIG. 1 depicts a schematic diagram of an audio amplifier circuit, a digital-to-analog converter, and an audio player according to some embodiments of the present disclosure.

A description is provided with reference to FIG. 1. FIG. 1 depicts a schematic diagram of an audio amplifier circuit 100, a digital-to-analog converter DAC, and an audio player A according to some embodiments of the present disclosure.

The audio amplifier circuit 100 can be a class D audio amplifier. The audio amplifier circuit 100 can be coupled between the digital-to-analog converter DAC and the audio player A. In greater detail, the audio amplifier circuit 100 and the digital-to-analog converter DAC can be coupled at an input terminal IN to receive an analog audio input signal VIN from the digital-to-analog converter DAC. The audio amplifier circuit 100 and the audio player A can be coupled at an output terminal OUT to output an analog audio output signal VOUT to the audio player A. The audio player A can play audio correspondingly based on the analog audio output signal VOUT. In some embodiments, the audio player A can be a speaker or other speaker device.

Take FIG. 1 for example, the audio amplifier circuit 100 includes an input resistor RIN, a pulse width modulation circuit 110, an auxiliary loop circuit 120, and a main loop circuit 130. The input resistor RIN is coupled between the input terminal IN and a node N1. The pulse width modulation circuit 110 is coupled between the node N1 and a node N2. The auxiliary loop circuit 120 is coupled between the node N2 and the node N1. The main loop circuit 130 is coupled between the node N2, the output terminal OUT, and the node N1.

Take FIG. 1 for example, the pulse width modulation circuit 110 includes a filter 111, a triangular wave generator 112, and a pulse width modulation generator 113. The filter 111 is coupled to the node N1. The filter 111 can generate a filtering signal FS based on the analog audio input signal VIN. The triangular wave generator 112 can generate a triangular wave signal RS. The pulse width modulation generator 113 can receive the filtering signal FS and the triangular wave signal RS to generate a pulse width modulation signal PWM. For example, the pulse width modulation generator 113 can compare the filtering signal FS and the triangular wave signal RS to generate the pulse width modulation signal PWM.

The auxiliary loop circuit 120 includes an auxiliary driver 121 and an auxiliary variable resistor RAUX. The auxiliary driver 121 is coupled to the node N2 to receive the pulse width modulation signal PWM and output a drive signal DS based on the pulse width modulation signal PWM. The auxiliary driver 121 can be corresponded to a variable resistance value. The auxiliary variable resistor RAUX is coupled between the auxiliary driver 121 and the node N1. The auxiliary variable resistor RAUX can be corresponded to a variable resistance value.

The main loop circuit 130 includes a power driver 131 and a feedback variable resistor RFB. The power driver 131 is coupled between the node N2 and the output terminal OUT. The power driver 131 can generate the analog audio output signal VOUT based on the pulse width modulation signal PWM. The power driver 131 can be corresponded to a variable current value. The feedback variable resistor RFB is coupled between the output terminal OUT and the node N1. The feedback variable resistor RFB can be corresponded to a variable resistance value.

Figure 2A:
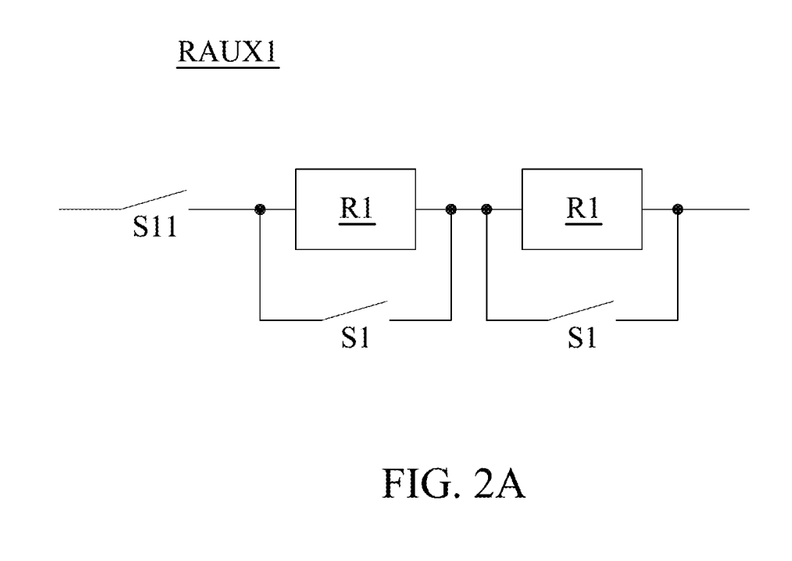
FIG. 2A depicts a schematic diagram of an auxiliary variable resistor according to some embodiments of the present disclosure.

A description is provided with reference to FIG. 2A. FIG. 2A depicts a schematic diagram of an auxiliary variable resistor RAUX1 according to some embodiments of the present disclosure. In some embodiments, the auxiliary variable resistor RAUX1 can be configured to implement the auxiliary variable resistor RAUX in FIG. 1. Take FIG. 2A for example, the auxiliary variable resistor RAUX1 includes a switch S11, a plurality of (e.g., two) resistors R1, and a plurality of (e.g., two) switches S1. The switch S11 is coupled in series with these resistors R1, and each of the switches S1 is coupled in parallel with one of the resistors R1 correspondingly. By controlling these switches S1, a variable resistance value of the auxiliary variable resistor RAUX1 can be changed.

The quantities of the above resistors R1 and switches S1 are only used as an example, and the present disclosure is not limited in this regard. Various other applicable quantities are within the scope of the present disclosure.

Figure 2B:
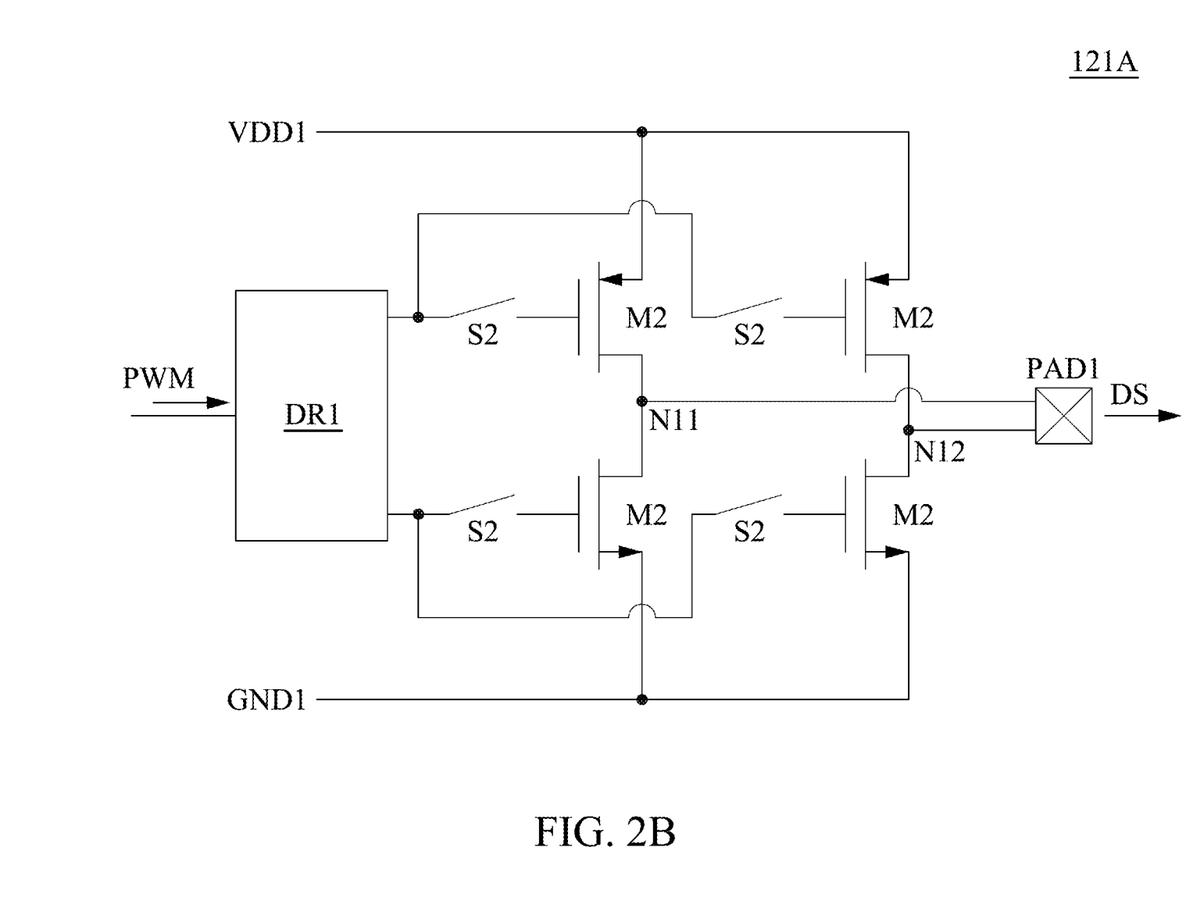
FIG. 2B depicts a schematic diagram of an auxiliary driver according to some embodiments of the present disclosure.

A description is provided with reference to FIG. 2B. FIG. 2B depicts a schematic diagram of an auxiliary driver 121A according to some embodiments of the present disclosure. In some embodiments, the auxiliary driver 121A can be configured to implement the auxiliary driver 121 in FIG. 1. Take FIG. 2B for example, the auxiliary driver 121A includes a pre-driver DR1, a plurality of (e.g., four) transistors M2, and a plurality of (e.g., four) switches S2. Each two transistors M2 can form a transistor string (in the figure the upper part shows P-type transistors and the lower part shows N-type transistors), and the two transistors M2 in each of transistor strings are coupled in series at a node N11 (or N12), and are coupled in series between a power supply terminal VDD1 and a ground terminal GND1. That is to say, the above transistor strings are coupled in parallel. The switches S2 are respectively coupled between the pre-driver DR1 and control terminals (such as gate terminals) of the transistors M2 correspondingly. The node N11 and the node N12 are coupled to an output pin PAD1 of the auxiliary driver 121A. By controlling these switches S2, a variable current value of the auxiliary driver 121A can be changed.

The quantities of the above transistors M2 and switches S2 are only used as an example, and the present disclosure is not limited in this regard. Various other applicable quantities are within the scope of the present disclosure.

Figure 2C:
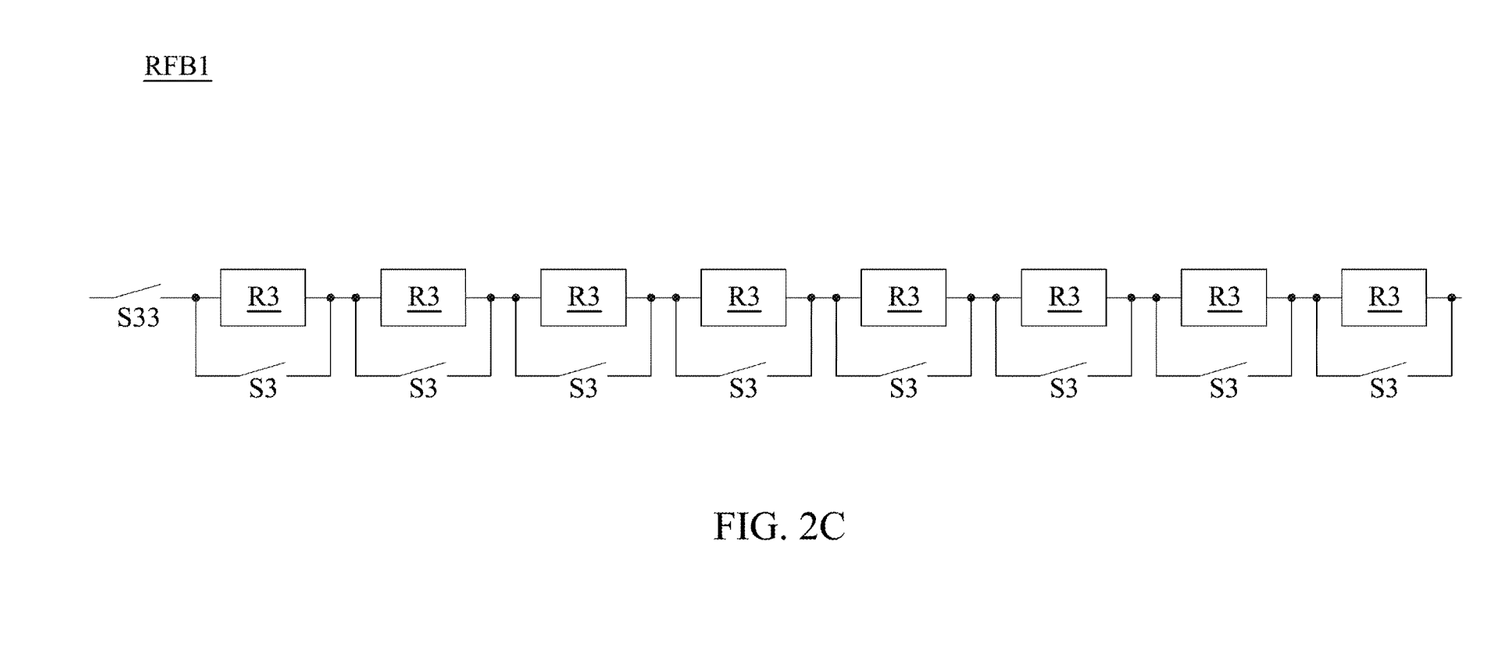
FIG. 2C depicts a schematic diagram of a feedback variable resistor according to some embodiments of the present disclosure.

A description is provided with reference to FIG. 2C. FIG. 2C depicts a schematic diagram of a feedback variable resistor RFB1 according to some embodiments of the present disclosure. In some embodiments, the feedback variable resistor RFB1 can be configured to implement the feedback variable resistor RFB in FIG. 1. Take FIG. 2C for example, the feedback variable resistor RFB1 includes a switch S33, a plurality of (e.g., eight) resistors R3, and a plurality of (e.g., eight) switches S3. The switch S33 is coupled in series with these resistors R3. Each of the switches S3 is coupled in parallel with one of the resistors R3 correspondingly. By controlling these switches S3, a variable resistance value of the feedback variable resistor RFB1 can be changed.

The quantities of the above resistors R3 and switches S3 are only used as an example, and the present disclosure is not limited in this regard. Various other applicable quantities are within the scope of the present disclosure.

Figure 2D:
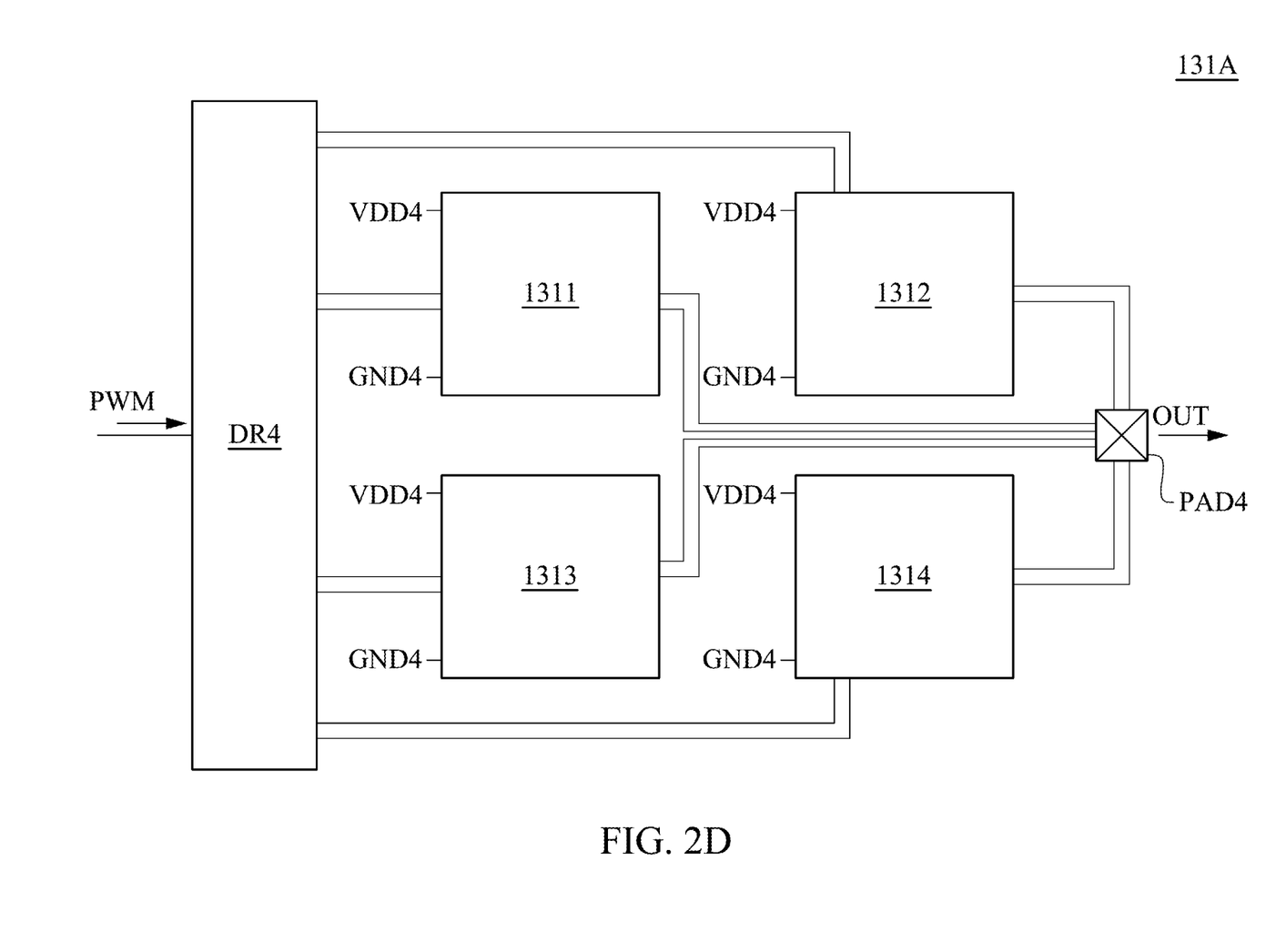
FIG. 2D depicts a schematic diagram of a main driver according to some embodiments of the present disclosure.

A description is provided with reference to FIG. 2D. FIG. 2D depicts a schematic diagram of a main driver 131A according to some embodiments of the present disclosure. In some embodiments, the main driver 131A can be configured to implement the main driver 131 in FIG. 1. Take FIG. 2D for example, the main driver 131A Includes a pre-driver DR4 and a plurality of (e.g., four) driving circuits 1311-1314. The driving circuits 1311-1314 are coupled between the pre-driver DR4 and an output pin PAD4.

Figure 2E:
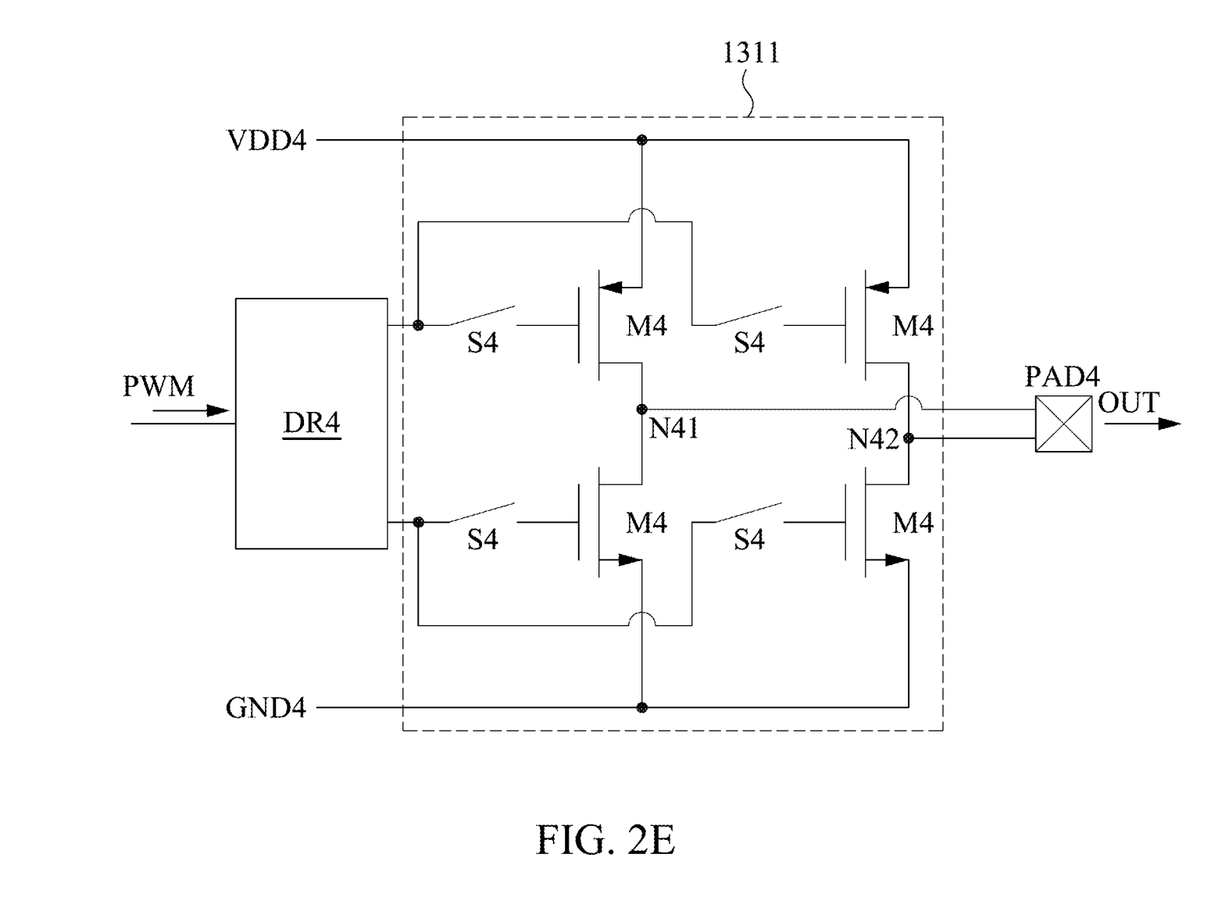
FIG. 2E depicts a detailed schematic diagram of a driving circuit in FIG. 2D according to some embodiments of the present disclosure.

A description is provided with reference to FIG. 2E. FIG. 2E depicts a schematic diagram of the driving circuit 1311 in FIG. 2D according to some embodiments of the present disclosure. The other driving circuits 1312-1314 have a similar circuit structure. Take FIG. 2E for example, the driving circuit 1311 includes a plurality of (e.g., four) transistors M4 and a plurality of (e.g., four) switches S4. Each two transistors M4 can form a transistor string (in the figure the upper part shows P-type transistors and the lower part shows N-type transistors). The two transistors M4 in each of transistor strings are coupled in series at a node N41 (or N42), and are coupled in series between a power supply terminal VDD4 and a ground terminal GND4. That is to say, the above transistor strings are coupled in parallel. The switches S4 are respectively coupled between the pre-driver DR4 and control terminals (such as gate terminals) of the transistors M4 correspondingly. The node N41 and the node N42 are coupled to an output pin PAD4 of the main driver 131A (as shown in FIG. 2D). By controlling these switches S4, a variable current value of the main driver 131A can be changed.

The quantities of the above transistors M4 and switches S4 are only used as an example, and the present disclosure is not limited in this regard. Various other applicable quantities are within the scope of the present disclosure.

In some embodiments, the switches S1-S4 can be controlled to be turned on or turned off by one or more control circuits inside or outside the audio amplifier circuit 100.

Figure 3A:
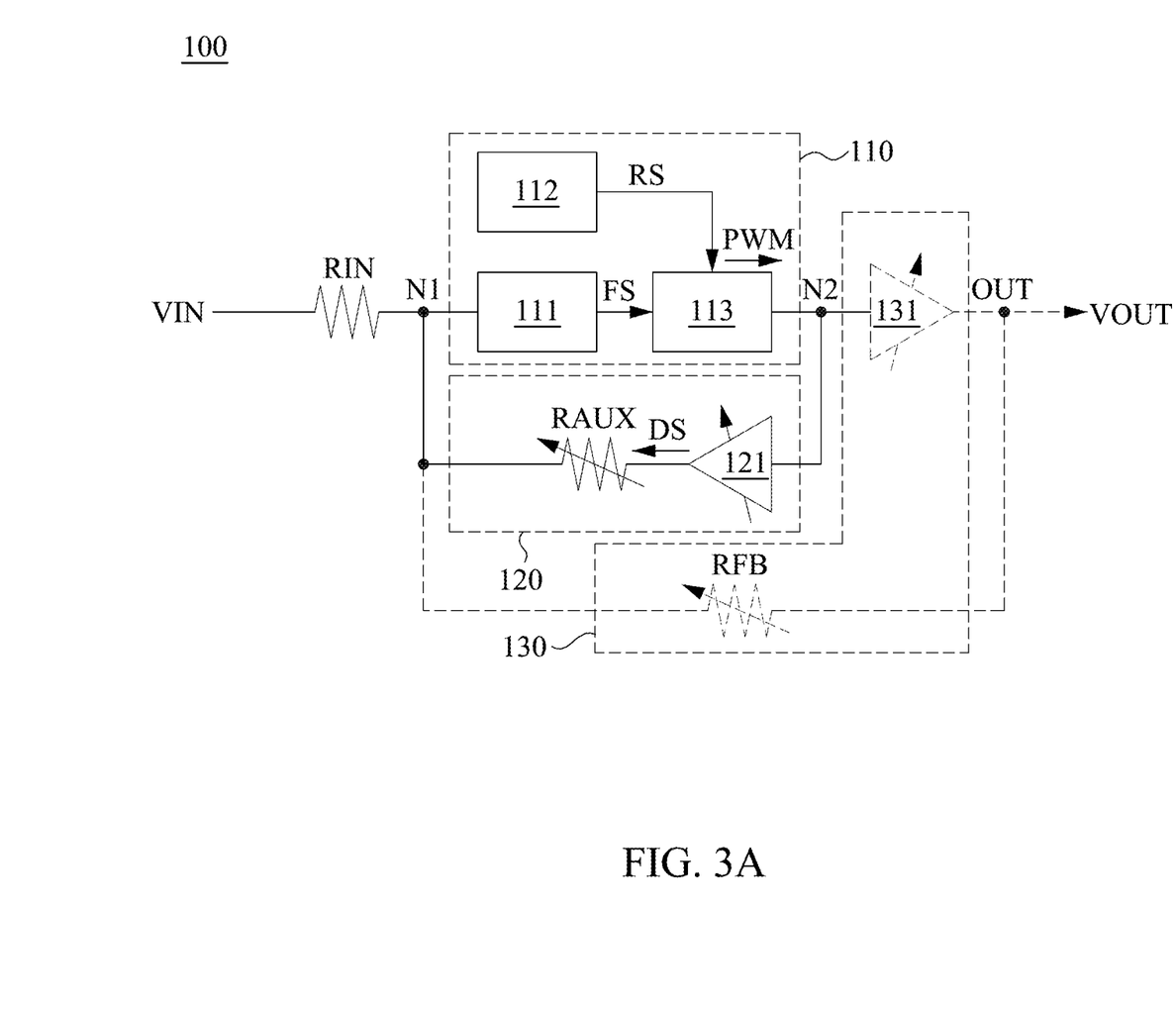
FIGS. 3A-3C depict schematic diagrams of operations of the audio amplifier circuit in FIG. 1 according to some embodiments of the present disclosure.
Figure 3B:
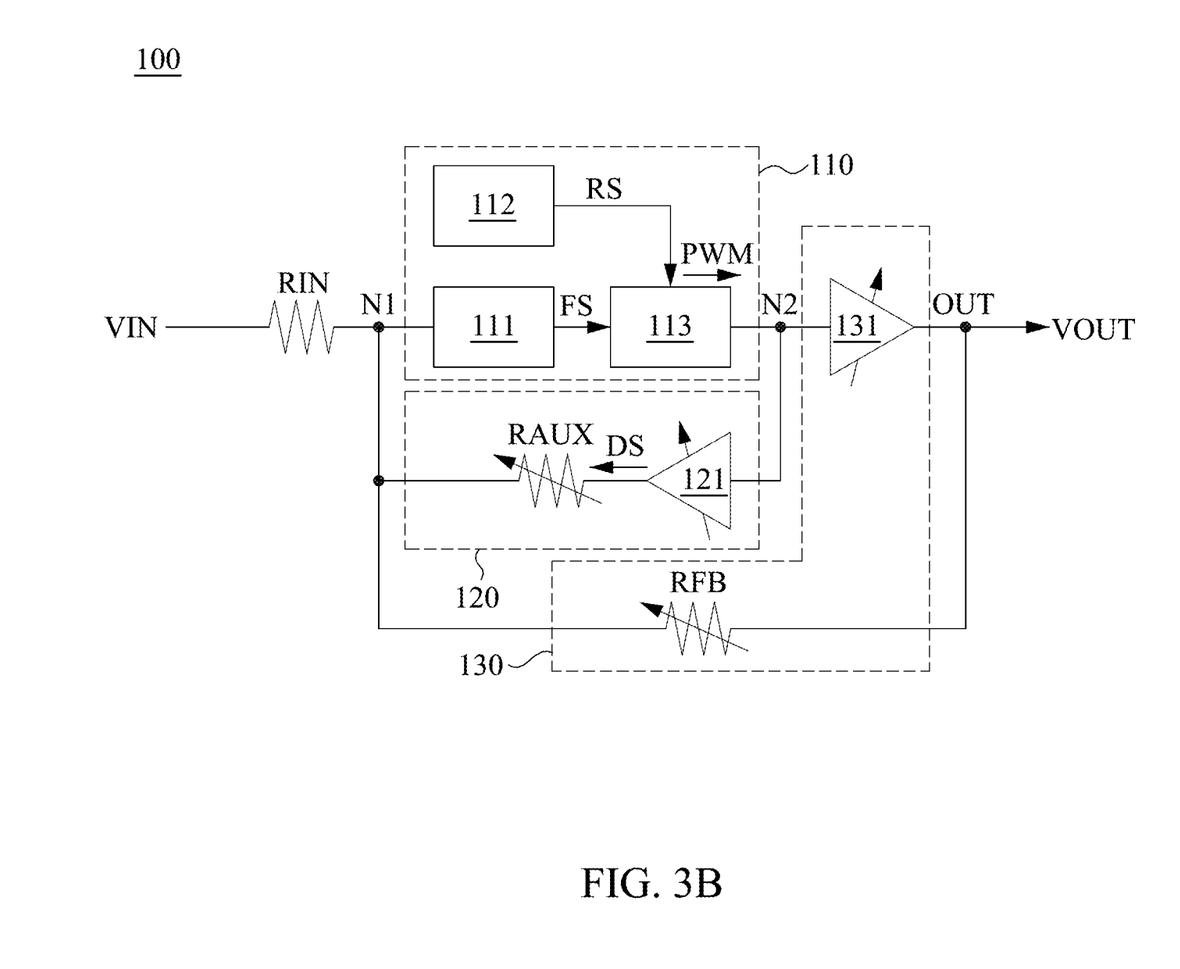
Figure 3C:
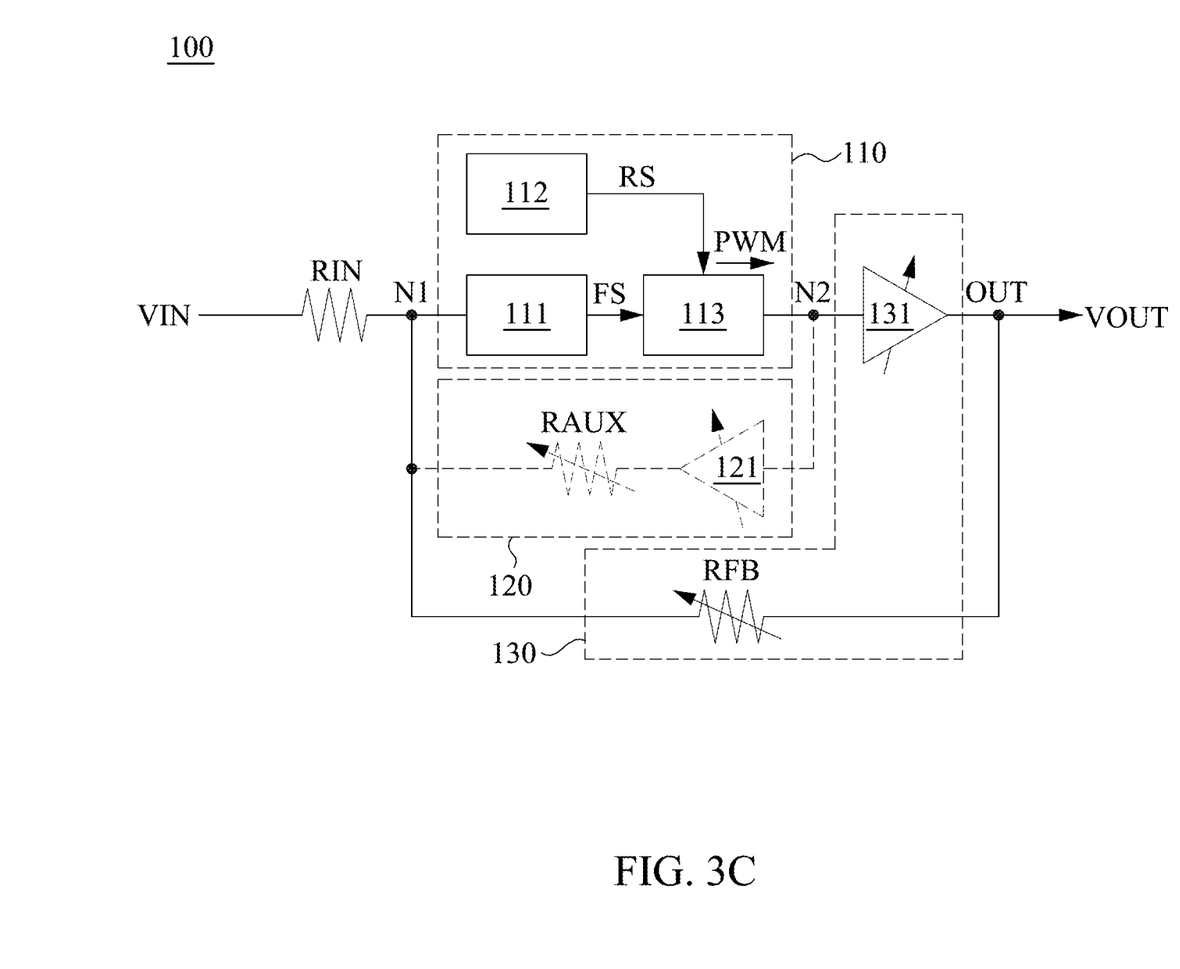
Figure 4:
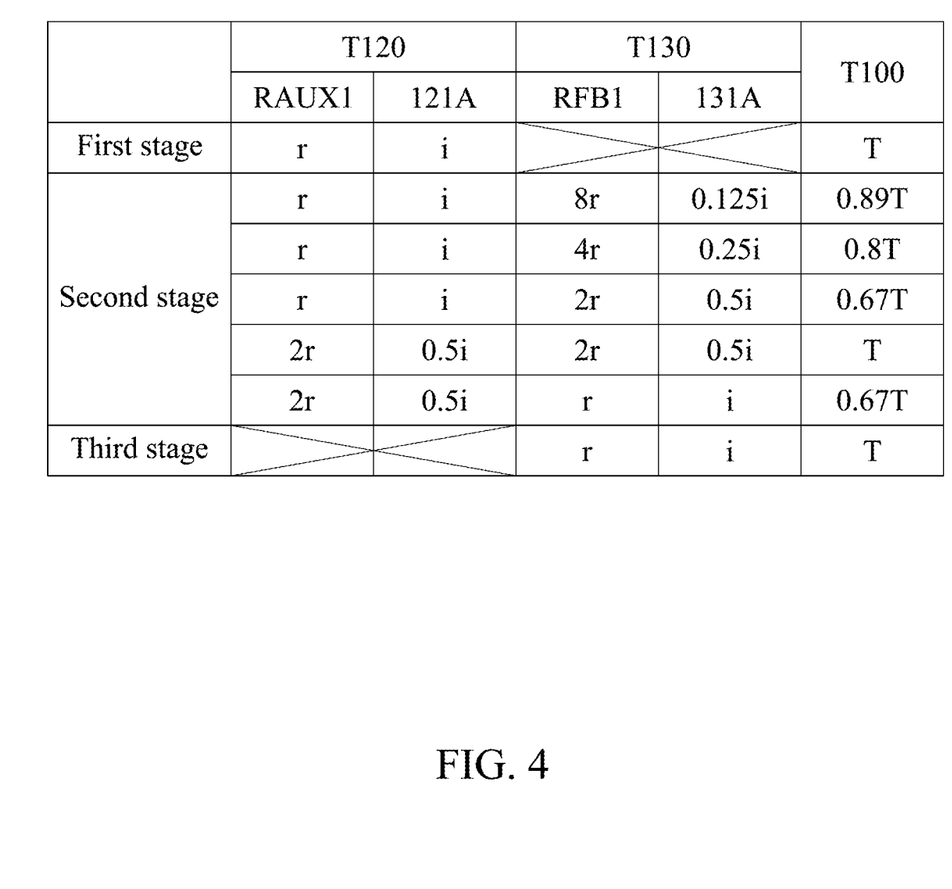
FIG. 4 depicts a schematic diagram of changes of the audio amplifier circuit in FIG. 1 according to some embodiments of the present disclosure.

A description is provided with reference to FIGS. 1-4. FIG. 3A to FIG. 3C depict schematic diagrams of operations of the audio amplifier circuit 100 in FIG. 1 according to some embodiments of the present disclosure. FIG. 4 depicts a schematic diagram of changes of the audio amplifier circuit 100 in FIG. 1 according to some embodiments of the present disclosure.

In a first stage, as shown in FIG. 3A, the auxiliary loop circuit 120 is turned on to establish a bias voltage for the pulse width modulation circuit 110, and the main loop circuit 130 is turned off.

The switch S11 of the auxiliary variable resistor RAUX1 in FIG. 2A is turned on. One of the switches S1 of the auxiliary variable resistor RAUX1 can be turned off and the other switch S1 can be turned on, such that the variable resistance value of the auxiliary variable resistor RAUX1 is r (it is assumed that a resistance value of one resistor R1 is r), as shown in FIG. 4. In addition, the two switches S2 of the auxiliary driver 121A in FIG. 2B can be turned on to control the two transistors M2 (in the figure a pair of transistors M2 on the left, one P-type transistor and one N-type transistor) to be both turned on and control the other two transistors M2 (in the figure a pair of transistors M2 on the right, one P-type transistor and one N-type transistor) to be both not turned on. Under this circumstance, the variable current value of the auxiliary driver 121A is i.

Additionally, the switch S33 of the feedback variable resistor RFB1 in FIG. 2C is not turned on, and the switches (e.g., the switches S4 shown in FIG. 2E) in the driving circuits 1311-1314 in the main driver 131A of FIG. 2D can all be not turned on to turn off the main loop circuit 130. At this time, a transfer function T100 of the audio amplifier circuit 100 (including the contribution of a transfer function T120 of the auxiliary loop circuit 120 and a transfer function T130 of the main loop circuit 130) is T.

Then, the operation enters into a second stage. As shown in FIG. 3B, the auxiliary loop circuit 120 is kept turned on, and the main loop circuit 130 is turned on. That is, both the auxiliary loop circuit 120 and the main loop circuit 130 are turned on.

Take FIG. 4 for example, the variable resistance value of the auxiliary variable resistor RAUX1 in FIG. 2A is kept at r and the variable current value of the auxiliary driver 121A in FIG. 2B is kept at i (first control state). In addition to that, in FIG. 2C the switches S3 of the feedback variable resistor RFB1 can all be not turned on and the switch S33 is turned on, such that the variable resistance value of the feedback variable resistor RFB1 is 8r (it is assumed that a resistance value of one resistor R3 is r). In addition, the two switches S4 of the main driver 131A in FIG. 2D (for example, a pair of switches S4 on the left of FIG. 2E) are turned on to control the corresponding transistors M4 to turn on (one pair of the transistors M4 at a time, one P-type transistor and one N-type transistor), and the other switches S4 (for example, the other switches S4 in the driving circuit 1311 and the switches S4 in the driving circuits 1312-1314) are not turned on to turn off the other transistors M4. Under this circumstance, the variable current value of the main driver 131A is 0.125i. At this time, the transfer function T100 of the audio amplifier circuit 100 is 0.89T (that is, 8Z(s)/8Z(s)+8Z(s))×T) (can be regarded as a parallel connection relationship), here Z(s) is an impedance transfer function.

After that, the switches S3 in FIG. 2C are controlled to adjust the variable resistance value of the feedback variable resistor RFB1 to 4r, and the switches in the driving circuits 1311-1314 in the main driver 131A of FIG. 2D (for example, the switches S4 in FIG. 2E) are controlled to adjust the variable current value of the main driver 131A to 0.25i. At this time, the transfer function T100 of the audio amplifier circuit 100 becomes 0.8T (that is, 4Z(s)/(Z(s)+4Z(s))×T).

Next, the switches S3 in FIG. 2C are controlled to adjust the variable resistance value of the feedback variable resistor RFB1 to 2r, and the switches in the driving circuits 1311-1314 in the main driver 131A of FIG. 2D (for example, the switches S4 in FIG. 2E) are controlled to adjust the variable current value of the main driver 131A to 0.5i. At this time, the transfer function T100 of the audio amplifier circuit 100 is 0.67T (that is, 2Z(s)/(Z(s)+2Z(s))×T).

Then, the variable resistance value of the feedback variable resistor RFB1 in FIG. 2C is kept at 2r and the variable current value of the main driver 131A in FIG. 2D is kept at 0.5i (enter into a second control state). Additionally, the switches S1 in FIG. 2A are controlled to adjust the variable resistance value of the auxiliary variable resistor RAUX1 to 2r and control the switches S2 in FIG. 2B to adjust the variable current value of the auxiliary driver 121A to 0.5i (is out of the first control state). At this time, the transfer function T100 of the audio amplifier circuit 100 is T (that is, 4Z(s)/(2Z(s)+2Z(s))×T).

To sum up the above paragraphs, in the second stage after the auxiliary loop circuit 120 enters into the first control state (the variable resistance value of the auxiliary variable resistor RAUX1 in FIG. 2A is r and the variable current value of the auxiliary driver 121A in FIG. 2B is i), the variable resistance value of the feedback variable resistor RFB1 is gradually decreased and the variable current value of the main driver 131A is gradually increased, such that the main loop circuit 130 enters into the second control state. After the main loop circuit 130 enters into the second control state (the variable resistance value of the feedback variable resistor RFB1 in FIG. 2C is 2r and the variable current value of the main driver 131A in FIG. 2D is 0.5i), the variable resistance value of the auxiliary variable resistor RAUX1 is increased and the variable current value of the auxiliary driver 121A is decreased, such that the auxiliary loop circuit 120 is out of the first control state.

After that, the operation enters into a third stage. As shown in FIG. 3C, the main loop circuit 130 is kept turned on, and the auxiliary loop circuit 120 is turned off. For example, the switch S11 of the auxiliary variable resistor RAUX1 in FIG. 2A can be turned off and the switches S2 of the auxiliary driver 121A in FIG. 2B can all be turned off in order to turn off the auxiliary loop circuit 120. As shown in FIG. 4, at this time the transfer function T100 of the audio amplifier circuit 100 is restored to T.

In some related technologies, during the turn-on process of the audio amplifier circuit, pop noises are generated due to an instantaneous huge voltage change, thus causing uncomfortable hearing experience for the user.

As compared with the above related technologies, in the present disclosure the auxiliary loop circuit 120 is utilized in the first stage to establish the bias voltage for the pulse width modulation circuit 110, the main loop circuit 130 is turned on with multiple switching steps and a gradual operation in the second stage, and the auxiliary loop circuit 120 is turned off in the third stage. As a result, the pop noises can be effectively reduced to avoid the uncomfortable hearing experience for the user. In addition to that, in some embodiments of the present disclosure (e.g., FIG. 4), change amounts of the transfer function T100 between two adjacent switching steps are all less than 0.5T. Therefore, as compared with many related technologies, the present disclosure can effectively reduce the pop noises.

Figure 5:
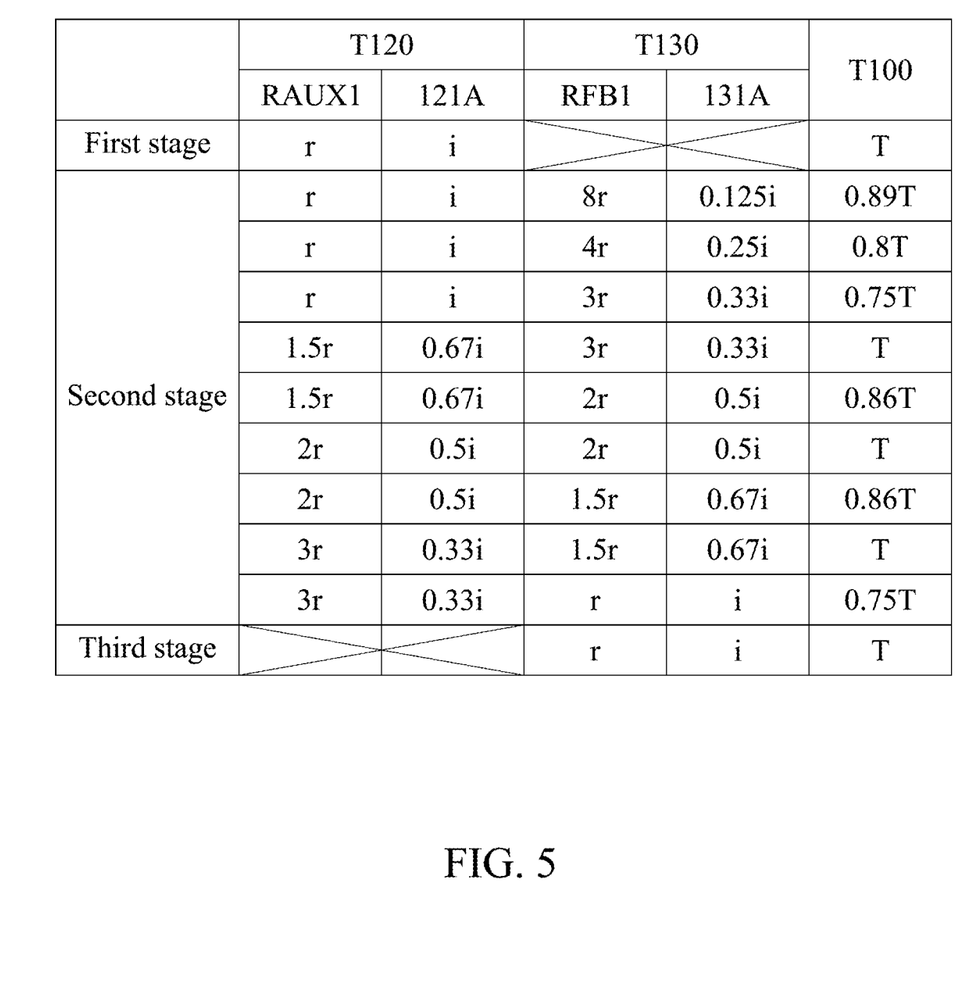
FIG. 5 depicts a schematic diagram of changes of the audio amplifier circuit in FIG. 1 according to some embodiments of the present disclosure.

FIG. 5 depicts a schematic diagram of changes of the audio amplifier circuit 100 of FIG. 1 according to some embodiments of the present disclosure. A first stage and a third stage of FIG. 5 are similar to the first state and the third stage of FIG. 4.

However, as compared with the second stage of FIG. 4, a second stage of FIG. 5 includes more switching steps. In other words, a change amount of the transfer function between two adjacent switching steps in the second stage of FIG. 5 is less than the change amounts of the transfer function between the two adjacent switching steps in the second stage of FIG. 4.

A description for FIG. 5 is provided with reference to FIGS. 1-2D.

Take FIG. 5 in which the second stage is shown for example. When the variable resistance value of the auxiliary variable resistor RAUX1 is kept at r and the variable current value of the auxiliary driver 121A is kept at i, the variable resistance value of the feedback variable resistor RFB1 can be adjusted to 8r and the variable current value of the main driver 131A can be adjusted to 0.125i. Next, the variable resistance value of the feedback variable resistor RFB1 can be adjusted (i.e., decreased) again to 4r and the variable current value of the main driver 131A can be adjusted (i.e., increased) again to 0.25i. Then, the variable resistance value of the feedback variable resistor RFB1 can be continuously adjusted (i.e., decreased) to 3r and the variable current value of the main driver 131A can be continuously adjusted (i.e., increased) to 0.33i.

After that, the variable resistance value of the feedback variable resistor RFB1 can be kept at 3r and the variable current value of the main driver 131A can be kept at 0.33i, and the variable resistance value of the auxiliary variable resistor RAUX1 can be adjusted (i.e., increased) to 1.5r and the variable current value of the auxiliary driver 121A can be adjusted (i.e., decreased) to 0.67i.

Next, the variable resistance value of the auxiliary variable resistor RAUX1 can be kept at 1.5r and the variable current value of the auxiliary driver 121A can be kept at 0.67i, and the variable resistance value of the feedback variable resistor RFB1 can be adjusted (i.e., decreased) to 2r and the variable current value of the main driver 131A can be adjusted (i.e., increased) to 0.5i.

Then, the variable resistance value of the feedback variable resistor RFB1 can be kept at 2r and the variable current value of the main driver 131A can be kept at 0.5i, and the variable resistance value of the auxiliary variable resistor RAUX1 can be adjusted (i.e., increased) to 2r and the variable current value of the auxiliary driver 121A can be adjusted (i.e., decreased) to 0.5i.

After that, the variable resistance value of the auxiliary variable resistor RAUX1 can be kept at 2r and the variable current value of the auxiliary driver 121A can be kept at 0.5i, and the variable resistance value of the feedback variable resistor RFB1 can be adjusted (i.e., decreased) to 1.5r and the variable current value of the main driver 131A can be adjusted (i.e., increased) to 0.67i.

Next, the variable resistance value of the feedback variable resistor RFB1 can be kept at 1.5r and the variable current value of the main driver 131A can be kept at 0.67i, and the variable resistance value of the auxiliary variable resistor RAUX1 can be adjusted (i.e., increased) to 3r and the variable current value of the auxiliary driver 121A can be adjusted (i.e., decreased) to 0.33i.

Then, the variable resistance value of the auxiliary variable resistor RAUX1 can be kept at 3r and the variable current value of the auxiliary driver 121A can be kept at 0.33i, and the variable resistance value of the feedback variable resistor RFB1 can be adjusted (i.e., decreased) to r and the variable current value of the main driver 131A can be adjusted (i.e., increased) to i.

Accordingly, as compared with FIG. 4, the change amount of the transfer function between two adjacent switching steps in FIG. 5 is lesser, and the pop noises can thus be reduced more effectively.

In some further embodiments, the second stage can include more and finer switching steps, such that the change amount of the transfer function between the two adjacent switching steps is lesser.

Figure 6:
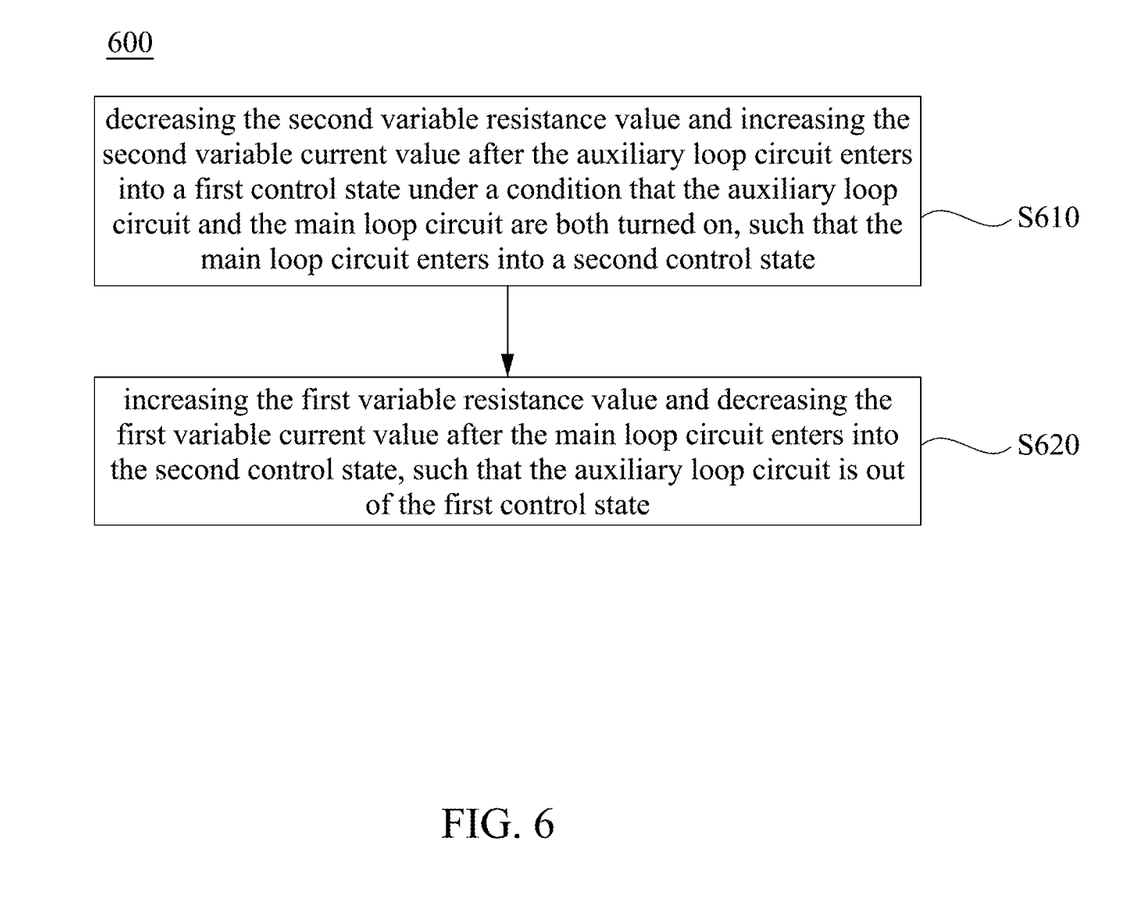
FIG. 6 depicts a flowchart of a controlling method according to some embodiments of the present disclosure.

A description is provided with reference to FIG. 6. FIG. 6 depicts a flowchart of a controlling method 600 according to some embodiments of the present disclosure. In some embodiments, the controlling method 600 can be applied to the audio amplifier circuit 100 in FIG. 1. Take FIG. 6 for example, the controlling method 600 includes operation S610 and operation S620.

In operation S610, under a condition that the auxiliary loop circuit 120 and the main loop circuit 130 are both turned on, a variable resistance value of the feedback variable resistor RFB is decreased and a variable current value of the main driver 131 is increased after the auxiliary loop circuit 120 enters into the above-mentioned first control state, such that the main loop circuit 130 enters into the above-mentioned second control state. Take FIG. 2C and FIG. 2E for example, the variable resistance value of the feedback variable resistor RFB1 and the variable current value of the main driver 1311 can be controlled by respectively controlling the switches S3 and the switches S4.

In operation S620, a variable resistance value of the auxiliary variable resistor RAUX is increased and a variable current value of the auxiliary driver 121 is decreased after the main loop circuit 130 enters into the second control state, such that the auxiliary loop circuit 120 is out of the first control state. Take FIG. 2A and FIG. 2B for example, the variable resistance value of the auxiliary variable resistor RAUX1 and the variable current value of the auxiliary driver 121A can be controlled by respectively controlling the switches S1 and the switches S2.

As described above, the audio amplifier circuit and the controlling method thereof according to the present disclosure can effectively reduce the pop noises to avoid the uncomfortable hearing experience for the user.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. An audio amplifier circuit comprising:
   a pulse width modulation circuit coupled between a first node and a second node;

an auxiliary loop circuit coupled between the second node and the first node, wherein the auxiliary loop circuit is corresponded to a first variable resistance value and a first variable current value; and a main loop circuit coupled between the second node, an output terminal, and the first node, wherein the main loop circuit is corresponded to a second variable resistance value and a second variable current value, wherein under a condition that the auxiliary loop circuit and the main loop circuit are both turned on, the second variable resistance value is decreased and the second variable current value is increased after the auxiliary loop circuit enters into a first control state such that the main loop circuit enters into a second control state, and the first variable resistance value is increased and the first variable current value is decreased after the main loop circuit enters into the second control state such that the auxiliary loop circuit is out of the first control state.

2. The audio amplifier circuit of claim 1, wherein the second variable resistance value is gradually decreased and the second variable current value is gradually increased after the auxiliary loop circuit enters into the first control state.

3. The audio amplifier circuit of claim 1, further comprising:

an input resistor coupled between an input terminal and the first node, wherein the input terminal is configured to receive an analog audio input signal, and the output terminal is configured to output an analog audio output signal to an audio player.

4. The audio amplifier circuit of claim 3, wherein the pulse width modulation circuit comprises:

a filter coupled to the first node and configured to generate a filtering signal based on the analog audio input signal;

a triangular wave generator configured to output a triangular wave signal; and a signal generator configured to receive the filtering signal and the triangular wave signal and coupled to the second node.

5. The audio amplifier circuit of claim 4, wherein the signal generator is configured to compare the filtering signal and the triangular wave signal to generate a pulse width modulation signal.

6. The audio amplifier circuit of claim 5, wherein the main loop circuit comprises:

a power driver coupled between the second node and the output terminal, and configured to generate the analog audio output signal based on the pulse width modulation signal; and a feedback variable resistor coupled between the output terminal and the first node, wherein the power driver is configured to control the second variable current value, and the feedback variable resistor is configured to control the second variable resistance value.

7. The audio amplifier circuit of claim 6, wherein the feedback variable resistor comprises:

a first switch;

a plurality of resistors, wherein the resistors and the first switch are coupled in series; and a plurality of second switches, wherein each of the second switches is coupled in parallel with one of the resistors correspondingly.

8. The audio amplifier circuit of claim 6, wherein the power driver comprises a plurality of driving circuits, wherein each of the driving circuits comprises:

a plurality of transistor strings, wherein each of the transistor strings comprises a plurality of transistors and the transistors are connected in series, wherein the transistor strings are coupled in parallel; and a plurality of switches, wherein each of the switches is coupled to a control terminal of one of the transistors correspondingly.

9. The audio amplifier circuit of claim 5, wherein the auxiliary loop circuit comprises:

an auxiliary driver coupled to the second node; and an auxiliary variable resistor coupled between the auxiliary driver and the first node, wherein the auxiliary driver is configured to control the first variable current value, and the auxiliary variable resistor is configured to control the first variable resistance value.

10. The audio amplifier circuit of claim 9, wherein the auxiliary variable resistor comprises:

a first switch;

a plurality of resistors, wherein the resistors and the first switch are coupled in series; and a plurality of second switches, wherein each of the second switches is coupled in parallel with one of the resistors correspondingly.

11. The audio amplifier circuit of claim 9, wherein the auxiliary driver comprises:

a plurality of transistor strings, wherein each of the transistor strings comprises a plurality of transistors and the transistors are connected in series, wherein the transistor strings are coupled in parallel; and a plurality of switches, wherein each of the switches is coupled to a control terminal of one of the transistors correspondingly.

12. The audio amplifier circuit of claim 1, wherein the auxiliary loop circuit is turned on and the main loop circuit is turned off before the auxiliary loop circuit and the main loop circuit are both turned on.

13. The audio amplifier circuit of claim 12, wherein the main loop circuit is kept turned on and the auxiliary loop circuit is finally turned off after the auxiliary loop circuit and the main loop circuit are both turned on.

14. A controlling method of an audio amplifier circuit, wherein the audio amplifier circuit comprises an auxiliary loop circuit and a main loop circuit, the auxiliary loop circuit is corresponded to a first variable resistance value and a first variable current value, and the main loop circuit is corresponded to a second variable resistance value and a second variable current value, wherein the controlling method comprises:

decreasing the second variable resistance value and increasing the second variable current value after the auxiliary loop circuit enters into a first control state under a condition that the auxiliary loop circuit and the main loop circuit are both turned on, such that the main loop circuit enters into a second control state; and increasing the first variable resistance value and decreasing the first variable current value after the main loop circuit enters into the second control state, such that the auxiliary loop circuit is out of the first control state.

15. The controlling method of claim 14, further comprising:

decreasing the second variable resistance value gradually and increasing the second variable current value gradually after the auxiliary loop circuit enters into the first control state.

16. The controlling method of claim 14, further comprising:

turning on the auxiliary loop circuit and turning off the main loop circuit before the auxiliary loop circuit and the main loop circuit are both turned on.

17. The controlling method of claim 16, further comprising:

keeping turning on the main loop circuit and turning off the auxiliary loop circuit finally after the auxiliary loop circuit and the main loop circuit are both turned on.

* * * * *